US010521974B2

(12) United States Patent
Du et al.

(10) Patent No.: US 10,521,974 B2
(45) Date of Patent: Dec. 31, 2019

(54) METHOD AND APPARATUS FOR MONITORING AN AUTONOMOUS VEHICLE

(71) Applicant: GM GLOBAL TECHNOLOGY OPERATIONS LLC, Detroit, MI (US)

(72) Inventors: Xinyu Du, Oakland Township, MI (US); Wen-Chiao Lin, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 212 days.

(21) Appl. No.: 15/688,483

(22) Filed: Aug. 28, 2017

(65) Prior Publication Data

US 2019/0066397 A1 Feb. 28, 2019

(51) Int. Cl.
*G07C 5/00* (2006.01)
*G01R 31/00* (2006.01)
*G05D 1/00* (2006.01)
*G01R 31/44* (2006.01)
*G08G 1/16* (2006.01)

(52) U.S. Cl.
CPC ............. *G07C 5/00* (2013.01); *G01R 31/006* (2013.01); *G01R 31/44* (2013.01); *G05D 1/0088* (2013.01); *G08G 1/161* (2013.01); *G05D 2201/0213* (2013.01)

(58) Field of Classification Search
USPC .......................................................... 701/23
See application file for complete search history.

(56) References Cited

U.S. PATENT DOCUMENTS

| | | | |
|---|---|---|---|
| 2015/0331422 A1* | 11/2015 | Hartung | G05D 1/021 701/23 |
| 2017/0139411 A1* | 5/2017 | Hartung | H04L 12/40 |
| 2018/0050704 A1* | 2/2018 | Tascione | B60W 50/0205 |
| 2018/0284779 A1* | 10/2018 | Nix | G01C 21/3697 |
| 2018/0288848 A1* | 10/2018 | Gao | H05B 33/0848 |
| 2019/0066397 A1* | 2/2019 | Du | G01R 31/006 |

* cited by examiner

*Primary Examiner* — Tyler D Paige
(74) *Attorney, Agent, or Firm* — Quinn IP Law

(57) ABSTRACT

An autonomic vehicle control system includes a vehicle spatial monitoring system including a plurality of spatial sensors disposed to monitor a spatial environment proximal to the autonomous vehicle. A controller is in communication with the spatial sensors of the vehicle spatial monitoring system, and the controller includes a processor and a memory device including an instruction set. Evaluating operation of the autonomous vehicle includes commanding operation of an actuator that is disposed to effect operation of the autonomous vehicle and simultaneously monitoring dynamic operation of the autonomous vehicle via a plurality of the spatial sensors. The commanded operation of the actuator is correlated with the dynamic operation of the autonomous vehicle, and a fault can be detected in the actuator based upon the correlation.

17 Claims, 3 Drawing Sheets

METHOD AND APPARATUS FOR MONITORING AN AUTONOMOUS VEHICLE

INTRODUCTION

Autonomous vehicles can include on-board monitoring systems to detect occurrence of a fault or another indication of a need for service and/or vehicle maintenance.

SUMMARY

An autonomic vehicle control system is described, and includes a vehicle spatial monitoring system including a plurality of spatial sensors disposed to monitor a spatial environment proximal to the autonomous vehicle. A controller is in communication with the spatial sensors of the vehicle spatial monitoring system, and the controller includes a processor and a memory device including an instruction set. Evaluating operation of the autonomous vehicle includes commanding operation of an actuator that is disposed to effect operation of the autonomous vehicle and simultaneously monitoring dynamic operation of the autonomous vehicle via a plurality of the spatial sensors. The commanded operation of the actuator is correlated with the dynamic operation of the autonomous vehicle, and a fault can be detected in the actuator based upon the correlation.

An aspect of the disclosure includes the actuator being a braking system, wherein the spatial sensors include either a radar sensor or a camera that is disposed to monitor a speed and a trajectory of the vehicle, and wherein commanding operation of the actuator includes commanding a braking event. Correlating the commanded operation of the actuator and the dynamic operation of the autonomous vehicle includes correlating the braking event and the speed of the autonomous vehicle.

Another aspect of the disclosure includes the actuator being a drivetrain, wherein the spatial sensors include one of a radar sensor or a camera that is disposed to monitor a speed and a trajectory of the vehicle, and wherein commanding operation of the actuator includes commanding an acceleration event. Correlating the commanded operation of the actuator and the dynamic operation of the autonomous vehicle includes correlating the acceleration event and the speed of the autonomous vehicle.

Another aspect of the disclosure includes the actuator being a steering system, wherein the spatial sensors include one of a radar sensor or a camera that is disposed to monitor a speed and a trajectory of the vehicle, and wherein commanding operation of the actuator includes commanding a change in vehicle direction. Correlating the commanded operation of the actuator and the dynamic operation of the autonomous vehicle includes correlating the commanded change in the vehicle direction and the trajectory of the autonomous vehicle.

Another aspect of the disclosure includes the actuator being a headlamp controller operatively connected to a headlamp, wherein the spatial sensors include a camera that is disposed to monitor a spatial environment proximal to the vehicle, and wherein commanding operation of the actuator includes commanding activation of the headlamp via the headlamp controller. Correlating the commanded operation of the actuator and the dynamic operation of the autonomous vehicle includes correlating the commanded activation of the headlamp and an increased illumination of the spatial environment proximal to the vehicle.

Another aspect of the disclosure includes the actuator being a turn-signal controller operatively connected to a turn-signal lamp, wherein the spatial sensors include a camera that is disposed to monitor a spatial environment proximal to the vehicle, and wherein commanding operation of the actuator includes commanding activation of the turn-signal lamp via the turn-signal controller. Correlating the commanded operation of the actuator and the dynamic operation of the autonomous vehicle includes correlating the commanded activation of the turn-signal lamp and an increased illumination of the spatial environment proximal to the vehicle.

Another aspect of the disclosure includes a sensor disposed to monitor operation of an actuator that is disposed to effect operation of the autonomous vehicle. The method includes determining a difference between the commanded operation of the actuator and the monitored dynamic operation of the autonomous vehicle indicated by the spatial sensor, and determining a trend based upon the difference. A remaining service life for the sensor disposed to monitor operation of the actuator can be determined based upon the trend.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

It should be understood that the appended drawings are not necessarily to scale, and present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein.

Figure 1:
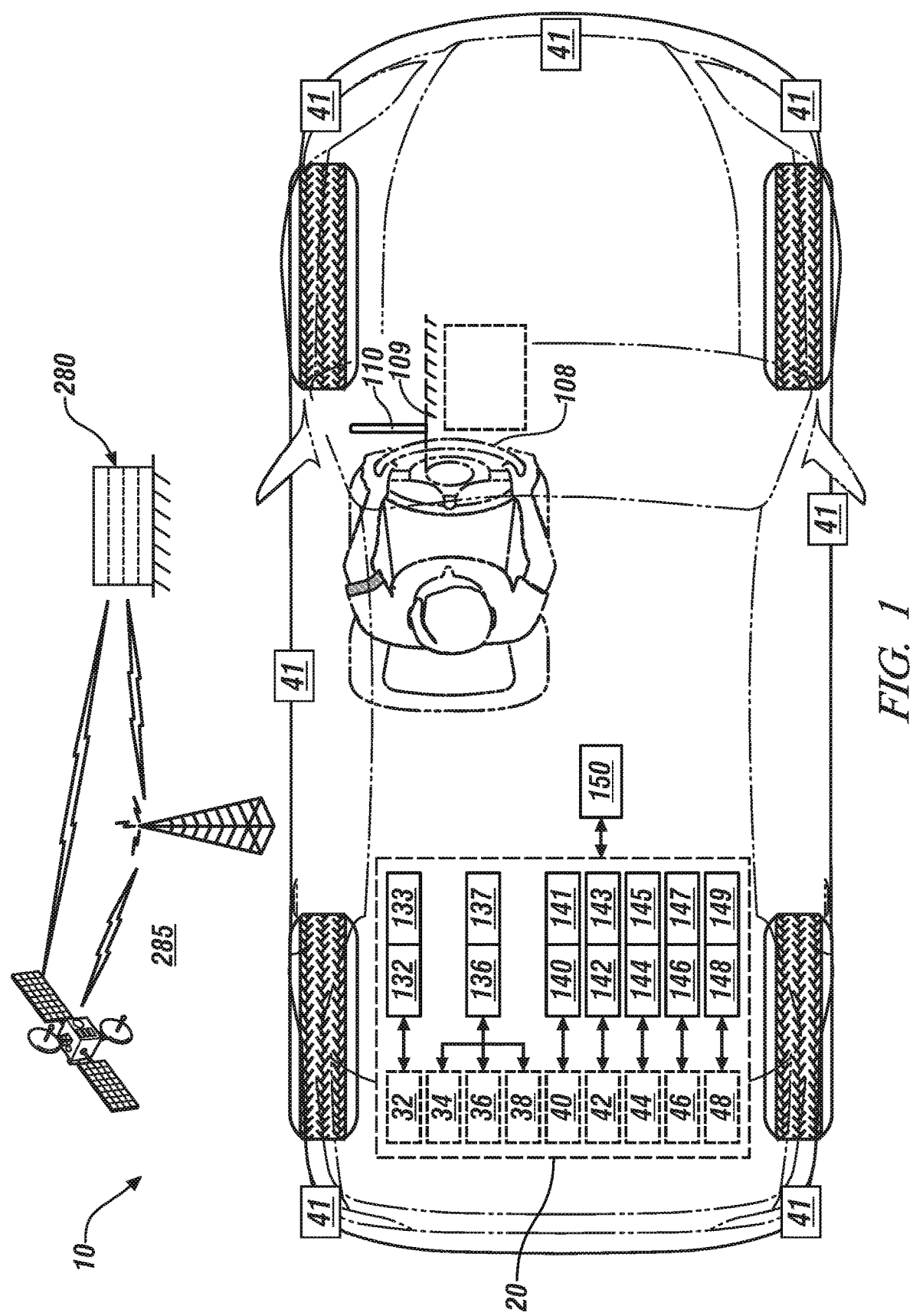
FIG. 1 schematically shows a vehicle including an autonomic vehicle control system and associated controllers, in accordance with the disclosure.

Referring to the drawings, wherein like reference numerals correspond to like or similar components throughout the several Figures, FIG. 1, consistent with embodiments disclosed herein, illustrates a vehicle 10 that includes an autonomic vehicle control system 20 and an associated vehicle health monitoring (VHM) controller 150 that is illustrative of the concepts described herein. The vehicle 10 includes, in one embodiment, a four-wheel passenger vehicle with steerable front wheels and fixed rear wheels. The vehicle 10 may include, by way of non-limiting examples, a passenger vehicle, a light-duty or heavy-duty truck, a utility vehicle, an agricultural vehicle, an industrial/warehouse vehicle, or a recreational off-road vehicle.

As employed herein, the autonomic vehicle control system 20 includes an on-vehicle control system that is capable of providing a level of driving automation. The terms 'driver' and 'operator' describe the person responsible for directing operation of the vehicle, whether actively involved in controlling one or more vehicle functions or directing autonomous vehicle operation. Driving automation can include a range of dynamic driving and vehicle operation. Driving automation can include some level of automatic control or intervention related to a single vehicle function, such as steering, acceleration, and/or braking, with the driver continuously having overall control of the vehicle. Driving automation can include some level of automatic control or intervention related to simultaneous control of multiple vehicle functions, such as steering, acceleration, and/or braking, with the driver continuously having overall control of the vehicle. Driving automation can include simultaneous automatic control of all vehicle driving functions, including steering, acceleration, and braking, wherein the driver cedes control of the vehicle for a period of time during a trip. Driving automation can include simultaneous automatic control of vehicle driving functions, including steering, acceleration, and braking, wherein the driver cedes control of the vehicle for an entire trip. Driving automation includes hardware and controllers configured to monitor a spatial environment under various driving modes to perform various driving tasks during dynamic operation. Driving automation can include, by way of non-limiting examples, cruise control, adaptive cruise control, lane-change warning, intervention and control, automatic parking, acceleration, braking, and the like.

The autonomic vehicle control system 20 preferably includes one or a plurality of vehicle systems and associated controllers that provide a level of driving automation, and the VHM controller 150 is disposed to monitor, prognosticate and/or diagnose operation of autonomic vehicle control system 20. The vehicle systems, subsystems and controllers associated with the autonomic vehicle control system 20 are implemented to execute one or a plurality of operations associated with autonomous vehicle functions, including, by way of non-limiting examples, an adaptive cruise control (ACC) operation, lane guidance and lane keeping operation, lane change operation, steering assist operation, object avoidance operation, parking assistance operation, vehicle braking operation, vehicle speed and acceleration operation, vehicle lateral motion operation, e.g., as part of the lane guidance, lane keeping and lane change operations, etc. The vehicle systems and associated controllers of the autonomic vehicle control system 20 can include, by way of non-limiting examples, a drivetrain 32 and drivetrain controller (PCM) 132; a steering system 34, a braking system 36 and a chassis system 38, which are controlled by a vehicle controller (VCM) 136; a vehicle spatial monitoring system 40 and spatial monitoring controller 140, a human-machine interface (HMI) system 42 and HMI controller 142; an HVAC system 44 and associated HVAC controller 144; operator controls 46 and an associated operator controller 146; and a vehicle lighting, illumination and external signaling system 48 and associated controller 148.

Each of the vehicle systems and associated controllers may further include one or more subsystems and one or more associated controllers. The subsystems and controllers are shown as discrete elements for ease of description. The foregoing classification of the subsystems is provided for purposes of describing one embodiment, and is illustrative. Other configurations may be considered within the scope of this disclosure. It should be appreciated that the functions described and performed by the discrete elements may be executed using one or more devices that may include algorithmic code, calibrations, hardware, application-specific integrated circuitry (ASIC), and/or off-board or cloud-based computing systems.

Each of the aforementioned controllers includes a VHM agent, which can be implemented and executed as algorithmic code, calibrations, hardware, application-specific integrated circuitry (ASIC), or other elements. Each of the VHM agents is configured to perform component and sub-system monitoring, feature extraction, data filtering and data recording for the associated controller. The data recording can include periodic and/or event-based data recording, single time-point data recording and/or consecutive time-point data recording for certain time duration, such as before and/or after the trigger of an event. Such data recording can be accomplished employing circular memory buffers or another suitable memory device.

The PCM 132 communicates with and is operatively connected to the drivetrain 32, and executes control routines to control operation of an engine and/or other torque machines, a transmission and a driveline, none of which are shown, to transmit tractive torque to the vehicle wheels in response to driver inputs, external conditions, and vehicle operating conditions. The PCM 132 is shown as a single controller, but can include a plurality of controller devices operative to control various powertrain actuators, including the engine, transmission, torque machines, wheel motors, and other elements of the drivetrain 32. By way of a non-limiting example, the drivetrain 32 can include an internal combustion engine and transmission, with an associated engine controller and transmission controller. Furthermore, the internal combustion engine may include a plurality of discrete subsystems with individual controllers, including, e.g., an electronic throttle device and controller, fuel injectors and controller, etc. The drivetrain 32 may also be composed of an electrically-powered motor/generator with an associated power inverter module and inverter controller. The control routines of the PCM 132 may also include an adaptive cruise control system (ACC) that controls vehicle speed, acceleration and braking in response to driver inputs and/or autonomous vehicle control inputs. The PCM 132 also includes a PCM VHM agent 133.

The VCM 136 communicates with and is operatively connected to a plurality of vehicle operating systems and executes control routines to control operation thereof. The vehicle operating systems can include braking, stability control, and steering, which can be controlled by actuators associated with the braking system 36, the chassis system 38 and the steering system 34, respectively, which are controlled by the VCM 136. The VCM 136 is shown as a single controller, but can include a plurality of controller devices operative to monitor systems and control various vehicle actuators. The VCM 136 also includes a VCM VHM agent 137.

The steering system 34 is configured to control vehicle lateral motion. The steering system 34 can include an electrical power steering system (EPS) coupled with an active front steering system to augment or supplant operator input through a steering wheel 108 by controlling steering angle of the steerable wheels of the vehicle 10 during execution of an autonomic maneuver such as a lane change maneuver. An exemplary active front steering system permits primary steering operation by the vehicle driver including augmenting steering wheel angle control to achieve a desired steering angle and/or vehicle yaw angle. Alternatively or in addition, the active front steering system can provide complete autonomous control of the vehicle steering function. It is appreciated that the systems described herein are applicable with modifications to vehicle steering control systems such as electrical power steering, four/rear wheel steering systems, and direct yaw control systems that control traction of each wheel to generate a yaw motion.

The braking system 36 is configured to control vehicle braking, and includes wheel brake devices, e.g., disc-brake elements, calipers, master cylinders, and a braking actuator, e.g., a pedal. Wheel speed sensors monitor individual wheel speeds, and a braking controller can be mechanized to include anti-lock braking functionality.

The chassis system 38 preferably includes a plurality of on-board sensing systems and devices for monitoring vehicle operation to determine vehicle motion states, and, in one embodiment, a plurality of devices for dynamically controlling a vehicle suspension. The vehicle motion states preferably include, e.g., vehicle speed, steering angle of the steerable front wheels, and yaw rate. The on-board sensing systems and devices include inertial sensors, such as rate gyros and accelerometers. The chassis system 38 estimates the vehicle motion states, such as longitudinal speed, yaw-rate and lateral speed, and estimates lateral offset and heading angle of the vehicle 10. The measured yaw rate is combined with steering angle measurements to estimate the vehicle state of lateral speed. The longitudinal speed may be determined based upon signal inputs from wheel speed sensors arranged to monitor each of the front wheels and rear wheels. Signals associated with the vehicle motion states that can be communicated to and monitored by other vehicle control systems for vehicle control and operation.

The vehicle spatial monitoring system 40 and spatial monitoring controller 140 can include a controller that communicates with a plurality of spatial sensors 41 to monitor fields of view proximal to the vehicle 10 and generate digital representations of the fields of view including proximate remote objects. The spatial monitoring controller 140 also includes a spatial monitoring VHM agent 141. The spatial monitoring controller 140 can evaluate inputs from the spatial sensors 41 to determine a linear range, relative speed, and trajectory of the vehicle 10 in relation to each proximate remote object. The spatial sensors 41 can be located at various locations on the vehicle 10, including the front corners, rear corners, rear sides and mid-sides. The spatial sensors 41 can include a front radar sensor and a camera in one embodiment, although the disclosure is not so limited. Placement of the aforementioned spatial sensors 41 permits the spatial monitoring controller 140 to monitor traffic flow including proximate vehicles and other objects around the vehicle 10. Data generated by the spatial monitoring controller 140 may be employed by a lane mark detection processor (not shown) to estimate the roadway. The spatial sensors 41 of the vehicle spatial monitoring system 40 can further include object-locating sensing devices including range sensors, such as FM-CW (Frequency Modulated Continuous Wave) radars, pulse and FSK (Frequency Shift Keying) radars, and Lidar (Light Detection and Ranging) devices, and ultrasonic devices which rely upon effects such as Doppler-effect measurements to locate forward objects. The possible object-locating devices include charged-coupled devices (CCD) or complementary metal oxide semi-conductor (CMOS) video image sensors, and other camera/video image processors which utilize digital photographic methods to 'view' forward objects including one or more proximal vehicle(s). Such sensing systems are employed for detecting and locating objects in automotive applications and are useable with systems including, e.g., adaptive cruise control, autonomous braking, autonomous steering and side-object detection.

The spatial sensors 41 associated with the vehicle spatial monitoring system 40 are preferably positioned within the vehicle 10 in relatively unobstructed positions to monitor the spatial environment. As employed herein, the spatial environment includes all external elements, including fixed objects such as signs, poles, trees, houses, stores, bridges, etc.; and, moving or moveable objects such as pedestrians and other vehicles. Each of these spatial sensors 41 provides an estimate of actual location or condition of an object, wherein said estimate includes an estimated position and standard deviation. As such, sensory detection and measurement of object locations and conditions are typically referred to as 'estimates.' It is further appreciated that the characteristics of these spatial sensors 41 are complementary, in that some are more reliable in estimating certain parameters than others. The spatial sensors 41 can have different operating ranges and angular coverages capable of estimating different parameters within their operating ranges. For example, radar sensors can usually estimate range, range rate and azimuth location of an object, but are not normally robust in estimating the extent of a detected object. A camera with vision processor is more robust in estimating a shape and azimuth position of the object, but is less efficient at estimating the range and range rate of an object. Scanning type lidar sensors perform efficiently and accurately with respect to estimating range, and azimuth position, but typically cannot estimate range rate, and are therefore not as accurate with respect to new object acquisition/recognition. Ultrasonic sensors are capable of estimating range but are generally incapable of estimating or computing range rate and azimuth position. Further, it is appreciated that the performance of each sensor technology is affected by differing environmental conditions. Thus, some of the spatial sensors 41 present parametric variances during operation, although overlapping coverage areas of the sensors create opportunities for sensor data fusion.

The HVAC system 44 is disposed to manage the ambient environment of the passenger compartment, including, e.g., temperature, humidity, air quality and the like, in response to operator commands that are communicated to the HVAC controller 144, which controls operation thereof. The HVAC controller 144 also includes an HVAC VHM agent 145.

The operator controls 46 may be included in the passenger compartment of the vehicle 10 and may include, by way of non-limiting examples, the steering wheel 108, an accelerator pedal, a brake pedal, a transmission range selector and an operator input device 110. The operator controls 46 and associated operator controller 146 enable a vehicle operator to interact with and direct operation of the vehicle 10. The operator controller 146 also includes an operator controller VHM agent 147. The operator control devices including the steering wheel, accelerator pedal, brake pedal, transmission range selector and the like may be omitted in some embodiments of the autonomous vehicle 10. The steering wheel 108 can be mounted on a steering column 109 with the input device 110 mechanically mounted on the steering column 109 and configured to communicate with the operator controller 146. Alternatively, the input device 110 can be mechanically mounted proximate to the steering column 109 in a location that is convenient to the vehicle operator. The input device 110, shown herein as a stalk projecting from column 109, can include an interface device by which the vehicle operator may command vehicle operation in one or more autonomic control modes, e.g., by commanding activation of element(s) of the autonomous vehicle control system 20. The mechanization of the input device 110 is illustrative. The input device 110 may be mechanized in one or more devices, or may be in the form of a controller that is voice-activated, or may be another suitable system. The input device 110 preferably has control features and a location that is used by present turn-signal activation systems. Alternatively, other input devices, such as levers, switches, buttons, and voice recognition input devices can be used in place of or in addition to the input device 110.

The HMI system 42 provides for human/machine interaction, for purposes of directing operation of an infotainment system, a GPS system, a navigation system and the like, and includes an HMI controller 142. The HMI controller 142 monitors operator requests and provides information to the operator including status of vehicle systems, service and maintenance information. The HMI controller 142 can also include a global positioning/navigation system. The HMI controller 142 communicates with and/or controls operation of a plurality of operator interface devices, wherein the operator interface devices are capable of transmitting a message associated with operation of one of the autonomic vehicle control systems. The HMI controller 142 preferably also communicates with one or more devices that monitor biometric data associated with the vehicle operator, including, e.g., eye gaze location, posture, and head position tracking, among others. The HMI controller 142 is depicted as a unitary device for ease of description, but may be configured as a plurality of controllers and associated sensing devices in an embodiment of the system described herein. The HMI controller 142 also includes an HMI VHM agent 143. Operator interface devices can include devices that are capable of transmitting a message urging operator action, and can include an electronic visual display module, e.g., a liquid crystal display (LCD) device, a heads-up display (HUD), an audio feedback device, a wearable device and a haptic seat. The operator interface devices that are capable of urging operator action are preferably controlled by or through the HMI controller 142. The HUD may project information that is reflected onto an interior side of a windshield of the vehicle, in the field of view of the operator, including transmitting a confidence level associated with operating one of the autonomous vehicle control systems. The HUD may also provide augmented reality information, such as lane location, vehicle path, directional and/or navigational information, and the like. HUD and related systems are known to those skilled in the art.

The vehicle lighting, illumination and external signaling system 48 includes a plurality of headlamps, taillamps, brake lamps, marker lamps, turn-signal/hazard lamps, and the like, which are controllable via the lighting controller 148. The lighting controller 148 is in communication with ambient light sensors, the GPS system, operator inputs and the navigation system, and executes control routines that selectively illuminate various ones of the headlamps, taillamps, brake lamps, marker lamps, signal lamps based upon the ambient light, the direction of intended travel from the GPS and navigation systems, and other factors. Other factors may include an override command to illuminate the vehicle lamps in a construction zone. The lighting controller 148 also includes a lighting VHM agent 149.

In one embodiment, the vehicle 10 is configured to communicate with the communication network 285, including communicating between a controller associated with an intelligent highway system and the vehicle 10. An intelligent highway system can be configured to monitor locations, speeds and trajectories of a plurality of vehicles, with such information employed to facilitate control of one or a plurality of similarly-situated vehicles. This can include communicating geographic location, forward velocity and acceleration rate of one or more vehicles in relation to the vehicle 10. In one embodiment, the vehicle 10 is configured to communicate with an off-board controller 280.

The VHM controller 150 is configured to autonomously monitor health of various on-board subsystems that perform one or more functions related to autonomous vehicle operation. The VHM controller 150 includes a controller architecture that is configured with multilayer hierarchical VHM data processing, collection, and storage employing the plurality of VHM agents that are associated with a VHM master controller that can communicate with the off-board controller 280. This configuration can serve to reduce data processing complexity, data collection and data storage costs. The VHM controller 150 provides a centralized system monitoring and a distributed system monitoring arrangement with data collection via the VHM master controller and the plurality of VHM agents to provide a rapid response time and an integrated vehicle/system level coverage. The VHM controller 150 can also include a fault mitigation controller and a redundant VHM master controller to verify integrity of VHM information employed by the fault mitigation controller.

The term "controller" and related terms such as control module, module, control, control unit, processor and similar terms refer to one or various combinations of Application Specific Integrated Circuit(s) (ASIC), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine-readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. The term 'model' refers to a processor-based or processor-executable code and associated calibration that simulates a physical existence of a device or a physical process. The terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine. The terms "calibration", "calibrate", and related terms refer to a result or a process that compares an actual or standard measurement associated with a device with a perceived or observed measurement or a commanded position. A calibration as described herein can be reduced to a storable parametric table, a plurality of executable equations or another suitable form.

Communication between controllers, and communication between controllers, actuators and/or sensors may be accomplished using a direct wired point-to-point link, a networked communication bus link, a wireless link or another suitable communication link. Communication includes exchanging data signals in suitable form, including, for example, electrical signals via a conductive medium, electromagnetic signals via air, optical signals via optical waveguides, and the like. The data signals may include discrete, analog or digitized analog signals representing inputs from sensors, actuator commands, and communication between controllers. The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium. A parameter is defined as a measurable quantity that represents a physical property of a device or other element that is discernible using one or more sensors and/or a physical model. A parameter can have a discrete value, e.g., either "1" or "0", or can be infinitely variable in value.

The terms "prognosis", "prognostics", and related terms are associated with data monitoring and algorithms and evaluations that render an advance indication of a likely future event associated with a component, a subsystem, or a system. Prognostics can include classifications that include a first state that indicates that the component, subsystem, or system is operating in accordance with its specification ("Green" or "G"), a second state that indicates deterioration in the operation of the component, subsystem, or system ("Yellow" or "Y"), and a third state that indicates a fault in the operation of the component, subsystem, or system ("Red" or "R"). The terms "diagnostics", "diagnosis" and related terms are associated with data monitoring and algorithms and evaluations that render an indication of presence or absence of a specific fault with a component, subsystem or system. The term "mitigation" and related terms are associated with operations, actions or control routine that operate to lessen the effect of a fault in a component, subsystem or system.

The telematics controller includes a wireless telematics communication system capable of extra-vehicle communications, including communicating with a communication network system 285 having wireless and wired communication capabilities. The telematics controller is capable of extra-vehicle communications that includes short-range vehicle-to-vehicle (V2V) communication. Alternatively or in addition, the telematics controller has a wireless telematics communication system capable of short-range wireless communication to a handheld device, e.g., a cell phone, a satellite phone or another telephonic device. In one embodiment the handheld device is loaded with a software application that includes a wireless protocol to communicate with the telematics controller, and the handheld device executes the extra-vehicle communication, including communicating with the off-board controller 280 via the communication network 285. Alternatively or in addition, the telematics controller executes the extra-vehicle communication directly by communicating with the off-board controller 280 via a communication network 285.

Prognostic classification routines to determine a prognostic, i.e., R/Y/G, for each of the subsystems can be executed in the VHM controller 150. The prognostic classification routines can detect occurrence of a Green prognostic associated with one of the vehicle subsystems and associated controllers of the autonomic vehicle control system 20, and the VHM controller 150 can block associated data transmission off board via the communication network 285 to reduce data communication load to the off-board controller 280. Alternatively, the transmission of a Green prognostic can be in the form of a simple acknowledgement of Green determination for a component, subsystem, or system of one of the vehicle systems and associated controllers of the autonomic vehicle control system 20 with a time stamp, thus minimizing the data transmission load to the off-board controller 280.

The VHM controller 150 includes executable routines that evaluate on-vehicle devices that monitor the spatial environment of the autonomous vehicle 10, including, e.g., the vehicle spatial monitoring system 40, spatial monitoring controller 140 and spatial monitoring VHM agent 141 that are described with reference to FIG. 1.

As described herein, the VHM controller 150 can include a diagnostic routine 200 for evaluating operation of the components of the drivetrain 32, the steering system 34, the braking system 36 and the chassis system 38 employing information from the spatial sensors 41. The diagnostic routine 200 includes commanding operation of an actuator that is disposed to effect vehicle motion and simultaneously monitoring dynamic operation of the autonomous vehicle via the spatial sensors 41, and correlating the commanded operation of the actuator and the monitored dynamic operation of the autonomous vehicle. A fault in the operation of the components of the drivetrain 32, the steering system 34, the braking system 36 and the chassis system 38 can be detected based upon the correlation. The diagnostic routine 200 is a control routine stored in a memory device in one of the vehicle controllers.

Figure 2:
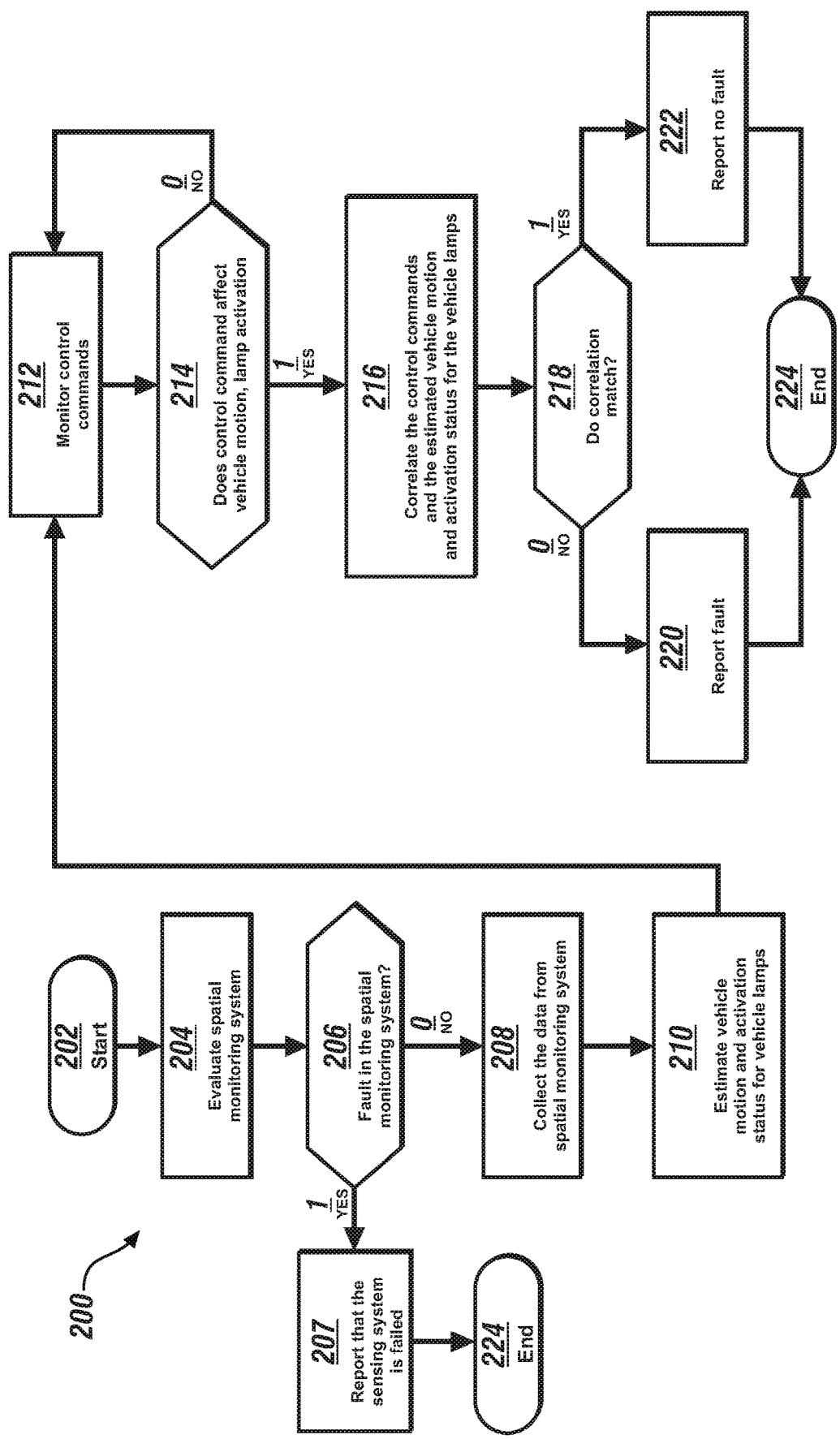
FIG. 2 schematically shows an embodiment of a diagnostic routine for evaluating operation of the components of the drivetrain, the steering system, the braking system and the chassis system employing information from spatial sensors, in accordance with the disclosure.

FIG. 2 schematically shows an embodiment of the diagnostic routine 200, and Table 1 is provided as a key wherein the numerically labeled blocks and the corresponding functions are set forth as follows, corresponding to the diagnostic routine 200. The teachings may be described herein in terms of functional and/or logical block components and/or various processing steps. It should be realized that such block components may be composed of hardware, software, and/or firmware components that have been configured to perform the specified functions.

TABLE 1

| BLOCK | BLOCK CONTENTS |
| --- | --- |
| 202 | Start |
| 204 | Evaluate the spatial monitoring system |
| 206 | Is there a fault in the spatial monitoring system? |

TABLE 1-continued

| BLOCK | BLOCK CONTENTS |
|---|---|
| 207 | Report fault in spatial monitoring system |
| 208 | Collect data from the spatial monitoring system |
| 210 | Estimate vehicle motion and activation status for vehicle lamps |
| 212 | Monitor control commands to the drivetrain, the steering system, the braking system and the chassis system |
| 214 | Does one of the control commands affect vehicle motion or vehicle lamp status? |
| 216 | Correlate the control commands and the estimated vehicle motion and activation status for the vehicle lamps |
| 218 | Do correlations match? |
| 220 | Report fault |
| 222 | Report no fault |
| 224 | End |

Execution of the diagnostic routine 200 may proceed as follows. The steps of the diagnostic routine 200 may be executed in a suitable order, and are not limited to the order described with reference to FIG. 2.

Upon initiation (202), operation of the spatial sensors 41 of the on-vehicle spatial monitoring system 40 are evaluated (204) to determine whether there is a fault in the spatial monitoring system (206). When a fault is detected in the spatial monitoring system (206)(1), the fault is reported (207), and this iteration ends (224).

When no fault is detected in the spatial monitoring system (206)(0), data is periodically and ongoingly collected from the spatial monitoring system (208), and evaluated to estimate vehicle motion including speed and direction of travel, and also to determine activation status of the vehicle headlamps, taillamps, brake lamps, marker lamps, signal lamps, and the like (210). Coincidently, control commands to the components of the drivetrain 32, the steering system 34, the braking system 36 and the chassis system 38 to effect vehicle operation are monitored (212) and evaluated to determine whether any of the control commands affects the vehicle motion or vehicle lamp status (214). If not (214)(0), the monitoring continues (212).

When any of the control commands affects the vehicle motion or vehicle lamp status (214)(1), the control commands are correlated with the estimated vehicle motion or vehicle lamp status (216). This can include, by way of non-limiting examples, generating a predefined rule base, such as correlating a brake command with vehicle deceleration, correlating an accelerator command with vehicle acceleration, correlating a steering command with vehicle lateral motion, correlating a headlamp activation command with increase in illumination proximal to the vehicle, and correlating a turn-signal command with a periodic increase in illumination.

When there is a positive correlation between the control commands and the associated estimated vehicle motion or vehicle lamp status (218)(1), no fault is reported (222), and this iteration ends (224). When there is no correlation between one of the control commands and the associated estimated vehicle motion or vehicle lamp status (218)(0), a fault associated with the specific system is reported, i.e., a fault associated with one of the components of the drivetrain 32, the steering system 34, the braking system 36 and the chassis system 38 is reported (220), and this iteration ends (224). The reporting function of steps 220 and 222 includes reporting the result to the operator via the HMI controller 142 and one of the operator interface devices, and can also report the result to a service center, via the off-board controller 280 and the communication network 285.

The VHM controller 150 can further include a service life routine 300 for evaluating and mitigating operation of the components of the drivetrain 32, the steering system 34, the braking system 36 and the chassis system 38 employing information from the spatial sensors 41. The service life routine 300 includes evaluating differences between the control commands to the components of the drivetrain 32, the steering system 34, the braking system 36 and the chassis system 38 and the inputs from the spatial sensors 41 of the on-vehicle spatial monitoring system 40 and evaluating trends based thereon. The service life routine 300 is a control routine stored in a memory device in one of the vehicle controllers and executes periodically.

Figure 3:
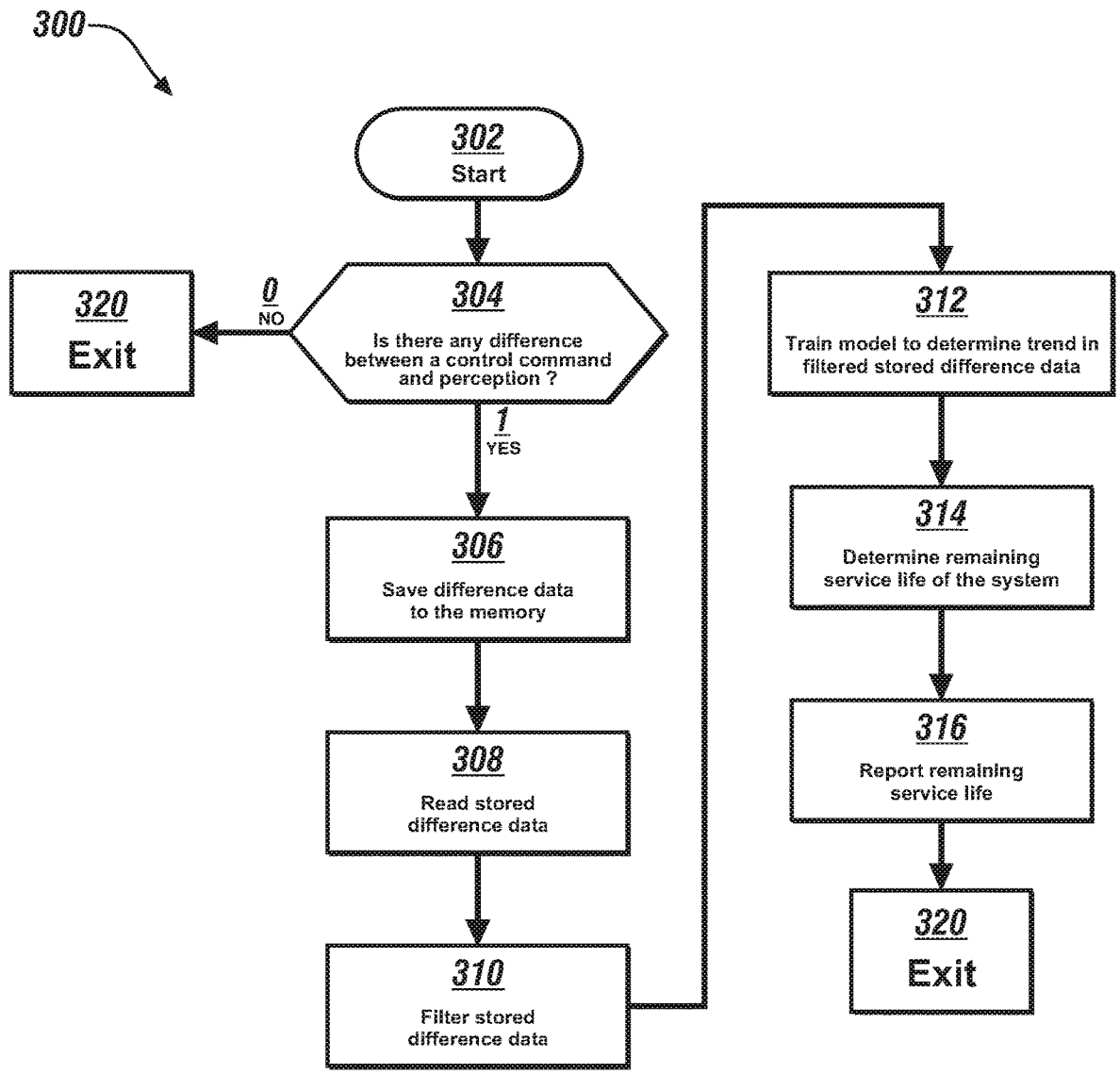
FIG. 3 schematically shows an embodiment of a service life routine for evaluating operation of the components of the drivetrain, the steering system, the braking system and the chassis system employing information from spatial sensors, in accordance with the disclosure.

FIG. 3 schematically shows an embodiment of the service life routine 300, and Table 2 is provided as a key wherein the numerically labeled blocks and the corresponding functions are set forth as follows, corresponding to the mitigation routine 300. The teachings may be described herein in terms of functional and/or logical block components and/or various processing steps. It should be realized that such block components may be composed of hardware, software, and/or firmware components that have been configured to perform the specified functions.

TABLE 2

| BLOCK | BLOCK CONTENTS |
|---|---|
| 302 | Start |
| 304 | Is there a difference between a control command and perception? |
| 306 | Save difference data in memory |
| 308 | Read stored difference data |
| 310 | Filter stored difference data |
| 312 | Train model to determine trend based upon the filtered stored difference data |
| 314 | Determine remaining service life of system |
| 316 | Report remaining service life |
| 320 | End |

Execution of the service life routine 300 may proceed as follows. The steps of the service life routine 300 may be executed in a suitable order, and are not limited to the order described with reference to FIG. 3.

Upon initiation (202), control commands to the components of the drivetrain 32, the steering system 34, the braking system 36 and the chassis system 38 are evaluated in relation to information derived from the spatial sensors 41. Each of the aforementioned systems includes one or a plurality of sensors that are disposed to monitor operation of related actuators that are disposed to effect operation of the autonomous vehicle. By way of example, the steering system 34 includes a steering angle sensor, and the braking system 36 includes wheel speed sensors. Control commands for the components of the drivetrain 32, the steering system 34, the braking system 36 and the chassis system 38 are monitored by the related sensors. The routine 300 determines whether there is a difference between the control commands and the perception as captured and indicated the spatial sensors 41 (304). Such differences can indicate errors associated with sensors of the drivetrain 32, the steering system 34, the braking system 36 and the chassis system 38, including, e.g., wheel speed sensors, steering angle sensors and inertial sensors, such as rate gyros and accelerometers.

When there is no difference or the difference is less than a threshold value (304)(0), this iteration ends without further action. When there is a difference that is greater than the threshold value (304)(1), the difference data is saved to memory (306). The difference data is periodically read and filtered by the controller (308), (310), and the filtered, difference data is input in a trend analysis model to identify a trend in the difference between the control commands and the perception as captured and indicated the spatial sensors 41 (312). Such trends indicate a rate of change in the difference, and the rate of change in the difference can be employed to estimate a remaining service life for one or more of the components of the drivetrain 32, the steering system 34, the braking system 36 and the chassis system 38 (314). The remaining service life can be reported out (316), which can include informing an off-vehicle service center, e.g., the VHM off-board controller 280 for scheduling a maintenance event. This iteration then ends (320).

The flowchart and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which includes one or more executable instructions for implementing the specified logical function(s). It will also be noted that each block of the block diagrams and/or flowchart illustrations, and combinations of blocks in the block diagrams and/or flowchart illustrations, may be implemented by special-purpose hardware-based systems that perform the specified functions or acts, or combinations of special-purpose hardware and computer instructions. These computer program instructions may also be stored in a computer-readable medium that can direct a controller or other programmable data processing apparatus to function in a particular manner, such that the instructions stored in the computer-readable medium produce an article of manufacture including instructions to implement the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. A method for evaluating an autonomous vehicle, the method comprising:
    commanding operation of an actuator that is disposed to effect operation of the autonomous vehicle and simultaneously monitoring dynamic operation of the autonomous vehicle via a controller and a plurality of spatial sensors;
    correlating the commanded operation of the actuator and the dynamic operation of the autonomous vehicle;
    detecting a fault in the actuator when there is no correlation between the commanded operation of the actuator and the dynamic operation of the autonomous vehicle; and
    reporting, via a human-machine interface system, occurrence of the fault;
    wherein the actuator includes a headlamp controller that is operatively connected to a headlamp;
    wherein the spatial sensors include a camera that is disposed to monitor a spatial environment proximal to the vehicle;
    wherein commanding operation of the actuator comprises commanding activation of the headlamp via the headlamp controller;
    wherein monitoring dynamic operation of the autonomous vehicle via the controller and the plurality of spatial sensors comprises monitoring, via the camera, illumination of the spatial environment proximal to the vehicle;
    wherein correlating the commanded operation of the actuator and the dynamic operation of the autonomous vehicle comprises correlating the activation of the headlamp and the illumination of the spatial environment proximal to the vehicle; and
    wherein detecting the fault in the actuator when there is no correlation between the commanded operation of the actuator and the dynamic operation of the autonomous vehicle comprises detecting a fault in the headlamp when there is no correlation between the illumination of the spatial environment proximal to the vehicle and the activation of the headlamp.

2. The method of claim 1, further comprising:
    wherein the actuator that is disposed to effect operation of the autonomous vehicle comprises a braking system;
    wherein the spatial sensors include a radar sensor that is disposed to monitor a speed and a trajectory of the vehicle;
    wherein commanding operation of the actuator comprises commanding a braking event;
    wherein correlating the commanded operation of the actuator and the dynamic operation of the autonomous vehicle comprises correlating the braking event and the speed of the autonomous vehicle that is determined via the radar sensor; and
    wherein detecting the fault in the actuator when there is no correlation between the commanded operation of the actuator and the dynamic operation of the autonomous vehicle comprises detecting a fault in the braking system when there is no correlation between the speed of the autonomous vehicle determined via the radar sensor and the braking event.

3. The method of claim 1, further comprising:
    wherein the actuator that is disposed to effect operation of the autonomous vehicle comprises a braking system;
    wherein the spatial sensors include a camera that is disposed to monitor a speed and a trajectory of the vehicle;
    wherein commanding operation of the actuator comprises commanding a braking event;
    wherein correlating the commanded operation of the actuator and the dynamic operation of the autonomous vehicle comprises correlating the braking event and the speed of the autonomous vehicle that is determined via the camera; and
    wherein detecting the fault in the actuator when there is no correlation between the commanded operation of the actuator and the dynamic operation of the autonomous vehicle comprises detecting a fault in the braking system when there is no correlation between the speed of the autonomous vehicle determined via the camera and the braking event.

4. The method of claim 1, further comprising:
    wherein the actuator that is disposed to effect operation of the autonomous vehicle comprises a drivetrain;
    wherein the spatial sensors include a radar sensor that is disposed to monitor a speed and a trajectory of the vehicle;

wherein commanding operation of the actuator comprises commanding an acceleration event;
wherein correlating the commanded operation of the actuator and the dynamic operation of the autonomous vehicle comprises correlating the acceleration event and the speed of the autonomous vehicle that is determined via the radar sensor; and
wherein detecting the fault in the actuator when there is no correlation between the commanded operation of the actuator and the dynamic operation of the autonomous vehicle comprises detecting a fault in the drivetrain when there is no correlation between the speed of the autonomous vehicle determined via the radar sensor and the acceleration event.

5. The method of claim 1, further comprising:
wherein the actuator that is disposed to effect operation of the autonomous vehicle comprises a drivetrain;
wherein the spatial sensors include a camera that is disposed to monitor a speed and a trajectory of the vehicle;
wherein commanding operation of the actuator comprises commanding an acceleration event;
wherein correlating the commanded operation of the actuator and the dynamic operation of the autonomous vehicle comprises correlating the acceleration event and the speed of the autonomous vehicle that is determined via the camera; and
wherein detecting the fault in the actuator when there is no correlation between the commanded operation of the actuator and the dynamic operation of the autonomous vehicle comprises detecting a fault in the drivetrain when there is no correlation between the speed of the autonomous vehicle determined via the camera and the acceleration event.

6. The method of claim 1, further comprising:
wherein the actuator that is disposed to effect operation of the autonomous vehicle comprises a steering system;
wherein the spatial sensors include a radar sensor that is disposed to monitor a speed and a trajectory of the vehicle;
wherein commanding operation of the actuator comprises commanding a change in vehicle direction;
wherein correlating the commanded operation of the actuator and the dynamic operation of the autonomous vehicle comprises correlating the commanded change in the vehicle direction and the trajectory of the autonomous vehicle that is determined via the radar sensor; and
wherein detecting the fault in the actuator when there is no correlation between the commanded operation of the actuator and the dynamic operation of the autonomous vehicle comprises detecting a fault in the drivetrain when there is no correlation between the speed of the autonomous vehicle determined via the radar sensor and the acceleration event.

7. The method of claim 1, further comprising:
wherein the actuator that is disposed to effect operation of the autonomous vehicle comprises a steering system;
wherein the spatial sensors include a camera that is disposed to monitor a speed and a trajectory of the vehicle;
wherein commanding operation of the actuator comprises commanding a change in vehicle direction via the steering system;
wherein correlating the commanded operation of the actuator and the dynamic operation of the autonomous vehicle comprises correlating the commanded change in the vehicle direction and the trajectory of the autonomous vehicle that is determined via the camera; and
wherein detecting the fault in the actuator when there is no correlation between the commanded operation of the actuator and the dynamic operation of the autonomous vehicle comprises detecting a fault in the steering system when there is no correlation between the vehicle direction and the trajectory of the autonomous vehicle determined via the camera and the commanded change in vehicle direction via the steering system.

8. The method of claim 1, further comprising:
wherein the actuator that is disposed to effect operation of the autonomous vehicle comprises a turn-signal controller operatively connected to a turn-signal lamp;
wherein the spatial sensors include a camera that is disposed to monitor a spatial environment proximal to the vehicle;
wherein commanding operation of the actuator comprises periodically commanding activation of the turn-signal lamp via the turn-signal controller;
wherein correlating the commanded operation of the actuator and the dynamic operation of the autonomous vehicle comprises correlating commanded activation of the turn-signal lamp and an illumination of the spatial environment proximal to the vehicle that is determined via the camera; and
wherein detecting the fault in the actuator when there is no correlation between the commanded operation of the actuator and the dynamic operation of the autonomous vehicle comprises detecting a fault in the turn-signal lamp when there is no correlation between the illumination of the spatial environment proximal to the vehicle and the periodic activation of the turn-signal lamp.

9. The method of claim 1, wherein the autonomous vehicle includes a sensor disposed to monitor operation of the actuator that is disposed to effect operation of the autonomous vehicle; and
wherein the method further comprises:
determining a difference between the commanded operation of the actuator and the monitored dynamic operation of the autonomous vehicle indicated by the sensor;
determining a trend based upon the difference; and
determining a remaining service life for the sensor disposed to monitor operation of the actuator based upon the trend; and
reporting the remaining service life for the sensor.

10. The method of claim 9, wherein reporting the remaining service life for the sensor comprises reporting the remaining service life for the sensor to a service center via an on-vehicle controller and a communication network.

11. The method of claim 1, further comprising reporting the occurrence of the fault to a service center via an on-vehicle controller and a communication network.

12. The autonomous vehicle of claim 11, wherein the instruction set is executable to report the occurrence of the fault to a vehicle operator via an on-board controller and to a service center via an on-vehicle controller and a communication network.

13. An autonomous vehicle, comprising:
a vehicle spatial monitoring system including a plurality of spatial sensors disposed to monitor a spatial environment proximal to the autonomous vehicle;
a controller in communication with the spatial sensors of the vehicle spatial monitoring system, the controller including a processor and a memory device, the memory device including an instruction set; the instruction set executable to:
command operation of an actuator that is disposed to effect operation of the autonomous vehicle and simultaneously monitor dynamic operation of the autonomous vehicle via the spatial sensors;
correlate the commanded operation of the actuator and the dynamic operation of the autonomous vehicle;
detect a fault in the actuator based upon the correlation; and
report occurrence of the fault
wherein the actuator that is disposed to effect operation of the autonomous vehicle comprises a turn-signal controller operatively connected to a turn-signal lamp;
wherein the spatial sensors include a camera that is disposed to monitor a spatial environment proximal to the vehicle;
wherein the commanded operation of the actuator comprises a periodically commanded activation of the turn-signal lamp via the turn-signal controller;
wherein the instruction set executable to correlate the commanded operation of the actuator and the dynamic operation of the autonomous vehicle comprises the instruction set executable to correlate the commanded activation of the turn-signal lamp and an illumination of the spatial environment proximal to the vehicle that is determined via the camera; and
wherein the instruction set executable to detect the fault in the actuator when there is no correlation between the commanded operation of the actuator and the dynamic operation of the autonomous vehicle comprises the instruction set executable to detect a fault in the turn-signal lamp when there is no correlation between the illumination of the spatial environment proximal to the vehicle and the periodic activation of the turn-signal lamp.

14. The autonomous vehicle of claim 13, further comprising:
wherein the actuator that is disposed to effect operation of the autonomous vehicle comprises a braking system;
wherein the spatial sensors include one of a camera, a lidar device and a radar sensor that is disposed to monitor a speed of the vehicle;
wherein the instruction set executable to command operation of the actuator comprises the instruction set executable to command a braking event;
wherein the instruction set executable to correlate the commanded operation of the actuator and the dynamic operation of the autonomous vehicle comprises the instruction set executable to correlate the braking event and the speed of the autonomous vehicle that is determined via the one of the camera, the lidar device and the radar sensor; and
wherein the instruction set executable to detect the fault in the actuator when there is no correlation between the commanded operation of the actuator and the dynamic operation of the autonomous vehicle comprises the instruction set executable to detect a fault in the braking system when there is no correlation between the speed of the autonomous vehicle determined via one of the camera, the lidar device and the radar sensor and the braking event.

15. The autonomous vehicle of claim 13,
wherein the actuator that is disposed to effect operation of the autonomous vehicle comprises a drivetrain;
wherein the spatial sensors include one of a camera, a lidar device and a radar sensor that is disposed to monitor a speed of the vehicle;
wherein the instruction set executable to command operation of the actuator comprises the instruction set executable to command an acceleration event;
wherein the instruction set executable to correlate the commanded operation of the actuator and the dynamic operation of the autonomous vehicle comprises the instruction set executable to correlate the acceleration event and the speed of the autonomous vehicle that is determined via the one of the camera, the lidar device and the radar sensor; and
wherein the instruction set executable to detect the fault in the actuator when there is no correlation between the commanded operation of the actuator and the dynamic operation of the autonomous vehicle comprises the instruction set executable to detect a fault in the drivetrain when there is no correlation between the speed of the autonomous vehicle determined via one of the camera, the lidar device and the radar sensor and the acceleration event.

16. The autonomous vehicle of claim 13, further comprising:
wherein the actuator that is disposed to effect operation of the autonomous vehicle comprises a steering system;
wherein the spatial sensors include one of a camera, a lidar device and a radar sensor that is disposed to monitor a trajectory of the vehicle;
wherein the instruction set executable to command operation of the actuator comprises the instruction set executable to command a change in vehicle direction via the steering system;
wherein the instruction set executable to correlate the commanded operation of the actuator and the dynamic operation of the autonomous vehicle comprises the instruction set executable to correlate the commanded change in vehicle direction and the trajectory of the autonomous vehicle that is determined via the one of the camera, the lidar device and the radar sensor; and
wherein the instruction set executable to detect the fault in the actuator when there is no correlation between the commanded operation of the actuator and the dynamic operation of the autonomous vehicle comprises the instruction set executable to detect a fault in the steering system when there is no correlation between the vehicle direction of the autonomous vehicle determined via one of the camera, the lidar device and the radar sensor and the commanded change in vehicle direction via the steering system.

17. The autonomous vehicle of claim 13, further comprising:
wherein the actuator that is disposed to effect operation of the autonomous vehicle comprises a headlamp controller operatively connected to a headlamp;
wherein the spatial sensors include a camera that is disposed to monitor a spatial environment proximal to the vehicle;
wherein the instruction set executable to command operation of the actuator comprises the instruction set executable to command activation of the headlamp via the headlamp controller;
wherein the instruction set executable to correlate the commanded operation of the actuator and the dynamic operation of the autonomous vehicle comprises the instruction set executable to correlate the commanded activation of the headlamp and an illumination of the spatial environment proximal to the vehicle that is determined via the camera; and wherein the instruction set executable to detect the fault in the actuator when there is no correlation between the commanded operation of the actuator and the dynamic operation of the autonomous vehicle comprises the instruction set executable to detect a fault in the headlamp when there is no correlation between the illumination of the spatial environment proximal to the vehicle and the activation of the headlamp.

* * * * *